United States Patent
Deak et al.

(10) Patent No.: US 11,852,698 B2
(45) Date of Patent: Dec. 26, 2023

(54) MAGNETIC SENSOR PACKAGING STRUCTURE WITH HYSTERESIS COIL

(71) Applicant: MultiDimension Technology Co., Ltd., Zhangjiagang (CN)

(72) Inventors: James Geza Deak, Zhangjiagang (CN); Elamparithi Visvanathan, Zhangjiagang (CN)

(73) Assignee: MultiDimension Technology Co., Ltd., Zhangjiagang (CN)

(*) Notice: Subject to any disclaimer, the term of this patent is extended or adjusted under 35 U.S.C. 154(b) by 809 days.

(21) Appl. No.: 16/497,409

(22) PCT Filed: Mar. 22, 2018

(86) PCT No.: PCT/CN2018/079920
§ 371 (c)(1),
(2) Date: Apr. 8, 2021

(87) PCT Pub. No.: WO2018/171648
PCT Pub. Date: Sep. 27, 2018

(65) Prior Publication Data
US 2023/0176148 A1    Jun. 8, 2023

(30) Foreign Application Priority Data
Mar. 24, 2017  (CN) .......................... 201710180998.1

(51) Int. Cl.
*G01R 33/09* (2006.01)
*G01R 33/00* (2006.01)

(52) U.S. Cl.
CPC ........ *G01R 33/091* (2013.01); *G01R 33/0011* (2013.01)

(58) Field of Classification Search
CPC .......................... G01R 33/0011; G01R 33/091
See application file for complete search history.

(56) References Cited

U.S. PATENT DOCUMENTS 5,952,825 A    9/1999   Wan
9,638,766 B2 * 5/2017   Diaconu ............ G01R 33/0017
(Continued)

FOREIGN PATENT DOCUMENTS

CN    103412269    11/2013
CN    103592608    2/2014
(Continued)

OTHER PUBLICATIONS

"International Application No. PCT/CN2018/079920, International Search Report and Written Opinion dated Jun. 19, 2018", (Jun. 19, 2018), 12 pgs.

*Primary Examiner* — Reena Aurora
(74) *Attorney, Agent, or Firm* — Schwegman Lundberg & Woessner, P.A.

(57) ABSTRACT

A magnetic sensor packaging structure with a hysteresis coil comprising a substrate, a sensor chip, a spiral hysteresis coil on the substrate, and wire bonding pads. The sensor bridge arms are composed of magnetoresistive sensing elements. The sensor bridge arms are deposited on the sensor chip, and the sensor bridge arms are electrically interconnected to form a magnetoresistive sensor bridge that is located on the hysteresis coil. The magnetic field generated by the spiral hysteresis coil is collinear with a sensitive axis of the sensor bridge. The magnetoresistive sensor bridge is located on the substrate and encapsulated. By placing the spiral hysteresis coil on the substrate, it is capable of supporting larger currents with smaller resistance value. This allows the sensor hysteresis to be effectively eliminated. In addition, the packaging structure manufacturing process is simple and cost effective.

10 Claims, 7 Drawing Sheets

(56) References Cited

U.S. PATENT DOCUMENTS

| | | |
|---|---|---|
| 9,702,943 B2 | 7/2017 | Deak |
| 9,857,434 B2 | 1/2018 | Deak |
| 9,885,764 B2 | 2/2018 | Deak et al. |
| 2009/0091344 A1* | 4/2009 | Ausserlechner ..... G01D 18/001 324/754.29 |
| 2009/0212771 A1* | 8/2009 | Cummings ........ G01R 33/0035 324/252 |
| 2016/0169982 A1 | 6/2016 | Deak |
| 2016/0245877 A1 | 8/2016 | Deak |
| 2018/0113179 A1 | 4/2018 | Deak et al. |

FOREIGN PATENT DOCUMENTS

| | | |
|---|---|---|
| CN | 103630855 | 3/2014 |
| CN | 104776794 | 7/2015 |
| CN | 205581283 U | 9/2016 |
| CN | 205720615 U | 11/2016 |
| CN | 107015171 A | 8/2017 |
| CN | 206671517 U | 11/2017 |
| WO | WO-2018171648 A1 | 9/2018 |

* cited by examiner

MAGNETIC SENSOR PACKAGING STRUCTURE WITH HYSTERESIS COIL

PRIORITY CLAIM TO RELATED APPLICATIONS

This application is a U.S. national stage filing under 35 U.S.C. § 371 from International Application No. PCT/CN2018/079920, filed on 22 Mar. 2018, and published as WO2018/171648 on 27 Sep. 2018, which claims the benefit under 35 U.S.C. 119 to Chinese Application No. 201710180998.1, filed on 24 Mar. 2017, the benefit of priority of each of which is claimed herein, and which applications and publication are hereby incorporated herein by reference in their entirety.

TECHNICAL FIELD

The present invention relates to the field of magnetic sensors, and more particularly to a magnetic sensor packaging structure with a hysteresis coil.

BACKGROUND

Encapsulation is essential for a semiconductor chip. The quality of the packaging technology also directly affects the performance of the chip itself and the design and manufacture of a PCB connected to the chip. There are a variety of semiconductor chip packaging formats, including LGA (Land Grid Array), Chip On Board, Flip chip, etc. These formats are easily applied to typical semiconductor dice, and there are other packaging methods also using a substrate, such as hybrid packaging used in aviation and automobile applications. LGA has attracted more and more attention and been used due to its ability to accommodate different interfaces, good mechanical stability, and good heat dissipation characteristics.

Honeywell has added an on-chip reset strap to its sensor chips that is used to align the magnetization of sensor elements. The disadvantage is that these reset strips make the sensor chips very large and expensive.

In the prior art, a hysteresis coil is included on the substrate of an LGA package, and it does not significantly change the size of the LGA package substrate. It should be noted that the LGA package substrate is just a PCB.

An LGA hysteresis coil includes conventional LGA package wiring, made of etched 35 or 70-micron copper, which can carry more current than Honeywell's on-chip conductors and has lower resistance due to the use of a copper material on the LGA substrate.

SUMMARY OF THE INVENTION

The packaging structure of the present invention is provided with a spiral hysteresis coil on a LGA substrate, wherein the corresponding hysteresis magnetic field pulse uses a bipolar fast current pulse and can be applied to each read cycle.

The present invention provides a low-cost magnetic sensor packaging structure with a hysteresis coil, which is implemented according to the following technical solution:

The magnetic sensor packaging structure includes a substrate, a sensor chip, a spiral hysteresis coil on the substrate, and wire bonding pads; sensor bridge arms are deposited on the sensor chip and are electrically interconnected to form a magnetoresistive sensor push-pull bridge; the sensor bridge arms include a push arm and a pull arm of the magnetoresistive sensor push-pull bridge and the push arm and the pull arm are composed of magnetoresistive sensing elements; and the magnetoresistive sensor push-pull bridge is a magnetoresistive sensor push-pull half bridge or a magnetoresistive sensor push-pull full bridge.

The magnetoresistive sensor push-pull bridge is located on the hysteresis coil, such that a magnetic field generated by the spiral hysteresis coil is collinear with a sensitive axis of the sensor bridge. The magnetoresistive sensor push-pull bridge is located on the substrate and encapsulated.

The magnetic sensor packaging structure further includes a pulse generating circuit and a signal processing circuit; the pulse generating circuit is configured to provide a positive magnetic field pulse and a negative magnetic field pulse; the pulse generating circuit includes a first voltage device and a second voltage device, the first voltage device outputs a positive voltage V1, the second voltage device outputs a negative voltage V2, and the signal processing circuit calculates an output voltage Vout=(V1+V2)/2 according to the positive voltage V1 and the negative voltage V2, and outputs the voltage through a voltage output circuit.

Further, the substrate is an LGA substrate, and the spiral hysteresis coil is deposited on the LGA substrate; the push arm of the magnetoresistive sensor push-pull bridge is deposited on a sensor chip, and the pull arm of the magnetoresistive sensor push-pull bridge is deposited on another sensor chip, wherein the sensor chips are deposited on the LGA substrate.

Further, the spiral hysteresis coil is disposed on a plane above or below the magnetoresistive sensing elements.

Further, the magnetic sensor packaging structure adopts single chip packaging, wherein the pinning layer directions of the magnetoresistive sensing elements are set by laser heating magnetic annealing.

Further, there are two or four sensor bridge arms that constitute a single-axis sensor, and the pinning layer directions of the magnetoresistive sensing elements of the oppositely disposed sensor bridge arms are opposite.

Further, there are four or eight sensor bridge arms that constitute a double-axis sensor, and the pinning layer directions of the magnetoresistive sensing elements of the oppositely disposed sensor bridge arms are opposite.

Further, the voltage output circuit is remotely acquired by a data calculation system.

Further, the magnetic sensor packaging structure includes an ASIC (application specific integrated circuit); the ASIC and the magnetoresistive sensor bridge are electrically connected, and the signal processing circuit and the voltage output circuit are both integrated in the ASIC.

Further, the direction of a magnetic field generated at the push arm by the spiral hysteresis coil is opposite to the direction of a magnetic field generated at the pull arm by the spiral hysteresis coil, the push arm is located on one side of the spiral hysteresis coil, and the pull arm is located on the other side of the helical hysteresis coil relative to the pull arm.

Further, the ASIC application specific integrated circuit is disposed on the LGA substrate.

Compared with the prior art, the present invention has the following technical effects:

According to the present invention, the spiral hysteresis coil is deposed on the substrate, so that the magnetic sensor has a smaller overall resistance and thus can carry larger current; the packaging structure not only eliminates the hysteresis generated by the sensor itself in a hysteresis cycle but also further reduces the hysteresis generated during measurement. In addition, the manufacturing process of the magnetic sensor packaging structure is simple and cost effective.

BRIEF DESCRIPTION OF THE DRAWINGS

In order to more clearly illustrate the technical solutions in the embodiments of the present invention or in the prior art, drawings to be used for description of embodiments and the prior art will be introduced briefly hereinafter. Obviously, drawings referred to in the following description are merely some embodiments of the present invention, and those skilled in the art may also conclude other drawings based on these drawings without creative efforts.

In the figures: 1—substrate, 2—spiral hysteresis coil, 3—sensor bridge arm, 4—pad, 5—pinning layer direction, 6—ASIC, 61—first capacitor, 62—second capacitor, 63—third capacitor, 64—fourth capacitor, 65—first transistor, 66—second transistor, 7—sensitive axis direction, 71—positive voltage, 72—negative voltage, 73—output voltage, 8—current direction, 9—magnetic field direction.

DETAILED DESCRIPTION

To make the objectives, technical solutions, and advantages of the embodiments of the present invention clearer, the technical solutions in the embodiments of the present invention will be described clearly and completely below with reference to the accompanying drawings in the embodiments of the present invention. It is apparent that the described embodiments are some rather than all the embodiments of the present invention. All other embodiments obtained by a person of ordinary skill in the art based on the embodiments of the present invention without creative efforts shall fall within the scope of the present invention.

Embodiment 1

Figure 1:
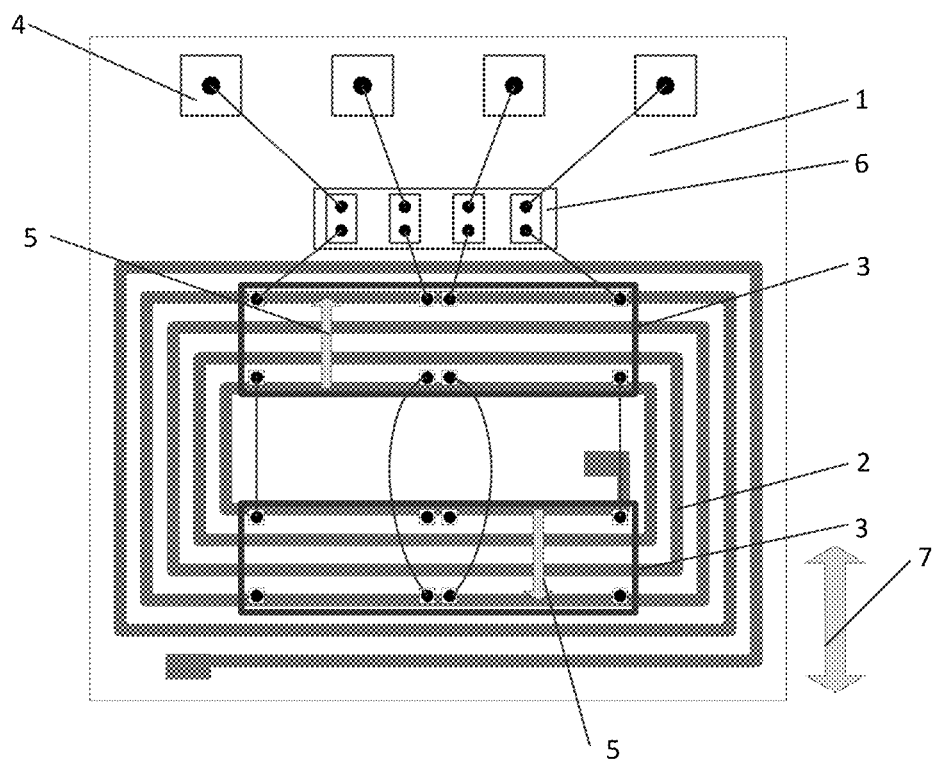
FIG. 1 is a schematic diagram of magnetic field sensing of a single-axis magnetic sensor packaging structure with a hysteresis coil according to Embodiment 1.

The embodiment provides a single-axis magnetic sensor packaging structure with a hysteresis coil, as shown in FIG. 1, which is a schematic diagram of magnetic field sensing of a single-axis magnetic sensor packaging structure with a hysteresis coil, where the single-axis magnetic sensor packaging structure includes a substrate 1, a sensor chip 3, a spiral hysteresis coil 2 disposed on the substrate 1, and wire bonding pads 4, and sensor bridge arms are deposited on the sensor chip 3.

Specifically, the sensor bridge arms are electrically interconnected to form a magnetoresistive sensor push-pull bridge; the sensor bridge arms are composed of magnetoresistive sensing elements and include a push arm and a pull arm of the magnetoresistive sensor push-pull bridge, and correspondingly, the push arm and the pull arm of the magnetoresistive sensor push-pull bridge are also composed of magnetoresistive sensing elements; and the magnetoresistive sensor push-pull bridge is a magnetoresistive sensor push-pull half bridge or a magnetoresistive sensor push-pull full bridge.

The magnetoresistive sensor push-pull bridge here is disposed on the spiral hysteresis coil 2, a magnetic field generated by the spiral hysteresis coil 2 is collinear with a sensitive axis of the sensor bridge. The magnetoresistive sensor push-pull bridge is located on the substrate 1 and encapsulated.

Further, the magnetic sensor packaging structure further includes a pulse generating circuit and a signal processing circuit; the pulse generating circuit is configured to provide a positive magnetic field pulse and a negative magnetic field pulse; the pulse generating circuit includes a first voltage device and a second voltage device, the first voltage device is configured to output a positive voltage V1, and the second voltage device is configured to output a negative voltage V2; and the signal processing circuit calculates an output voltage Vout=(V1+V2)/2 according to the positive voltage V1 and the negative voltage V2, and outputs the voltage through a voltage output circuit. As a feasible implementation manner, the output voltage may also be remotely acquired by a data calculation system.

Specifically, the substrate 1 is an LGA substrate, and the spiral hysteresis coil 2 is deposited on the LGA substrate, and the push arm of the magnetoresistive sensor push-pull bridge is deposited on a sensor chip; the pull arm of the magnetoresistive sensor push-pull bridge is deposited on another sensor chip, wherein the sensor chips are deposited on the LGA substrate.

Moreover, the magnetic sensor packaging structure adopts single chip packaging, wherein the pinning layer directions 5 of the magnetoresistive sensing elements are set by laser heating magnetic annealing.

It can be seen from FIG. 1 that the spiral hysteresis coil 2 is rectangular and two sensor bridge arms are disposed; the two sensor bridge arms are respectively located at the two symmetrical sides of the spiral hysteresis coil 2, constituting a single-axis sensor; the pinning layer directions 5 of the magnetoresistive sensing elements on the two oppositely disposed sensor bridge arms 3 are opposite.

Figure 3:
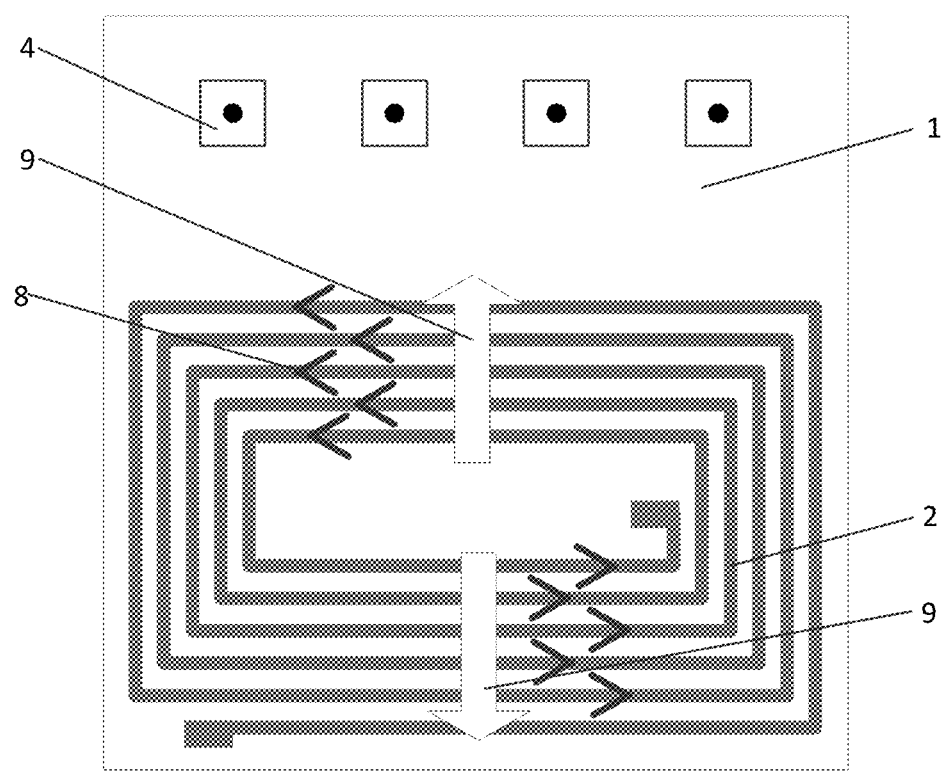
FIG. 3 is a schematic diagram of generation of a magnetic field when current passes through a coil according to Embodiment 1.

FIG. 3 is a schematic diagram of generation of a magnetic field when current passes through a coil according to the present invention. As shown in FIG. 3, the direction of the current is counterclockwise, and further, the magnetic field directions are opposite on both sides of the symmetrical portion of the spiral hysteresis coil 2 and are parallel to the direction of the sensitive axis.

Figure 4:
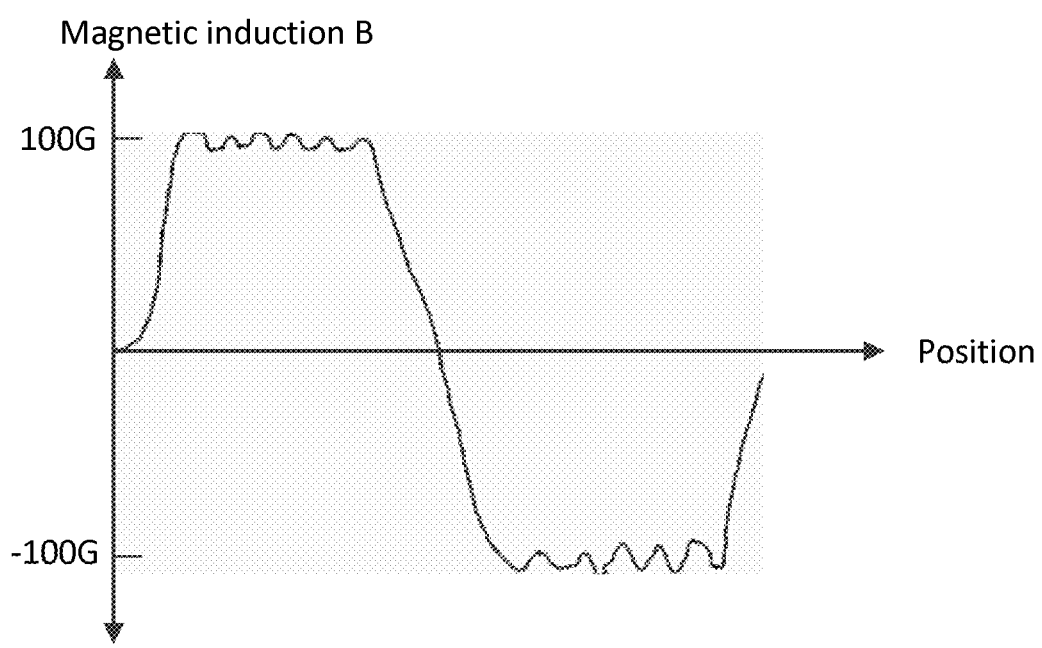
FIG. 4 is a schematic diagram of magnetic field distribution in the present invention according to Embodiment 1.

FIG. 4 is a schematic diagram of the magnetic field distribution according to the present invention. The magnetic field is measured along the position of the dotted line of FIG. 3. As shown in FIG. 4, the measured magnetic field is about 100 G. It should be noted that due to the fast current pulse and the spacing distribution of the spiral hysteresis coil 2, the magnetic field distribution needs to be further improved.

Figure 7:
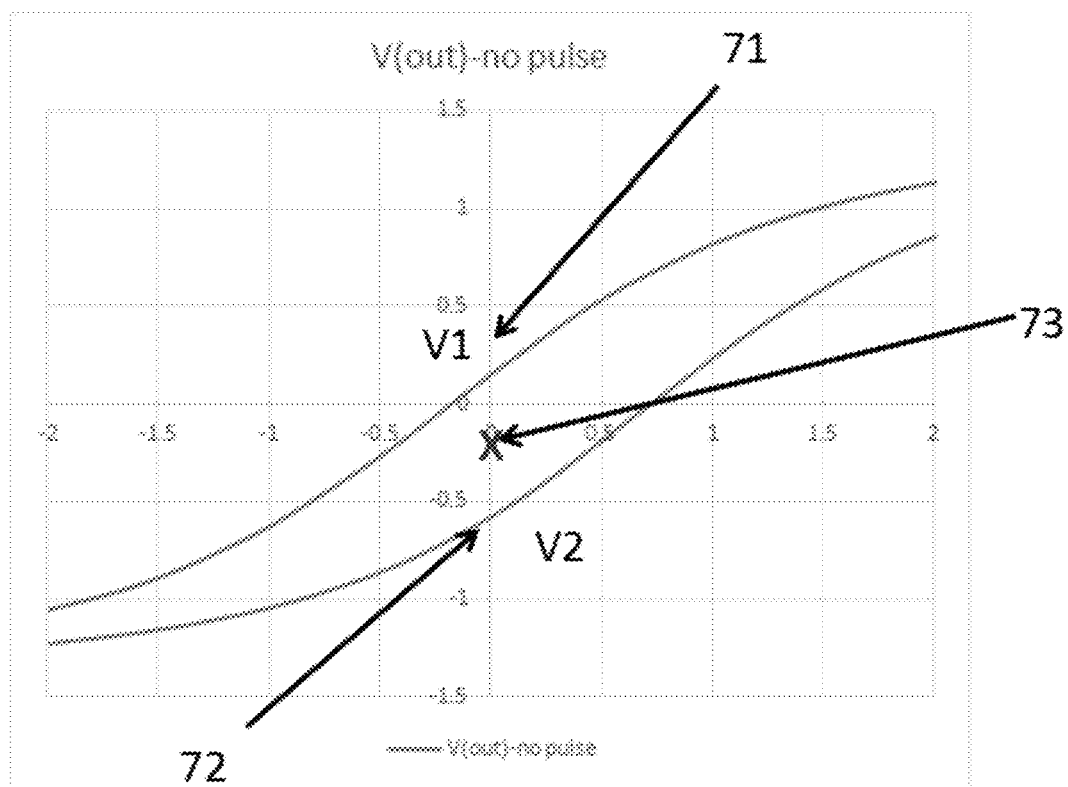
FIG. 7 is a schematic diagram showing voltage output according to Embodiment 1.

FIG. 7 is a schematic diagram of voltage output according to the present invention. A positive current pulse is applied in the sensing direction to read a positive voltage V1. Similarly, a negative current pulse is applied in the sensing direction to read a negative voltage V2. Assuming that the output voltage is Vout, the magnitude of the voltage output may be calculated according to the equation Vout=(V1+V2)/2.

Figure 8:
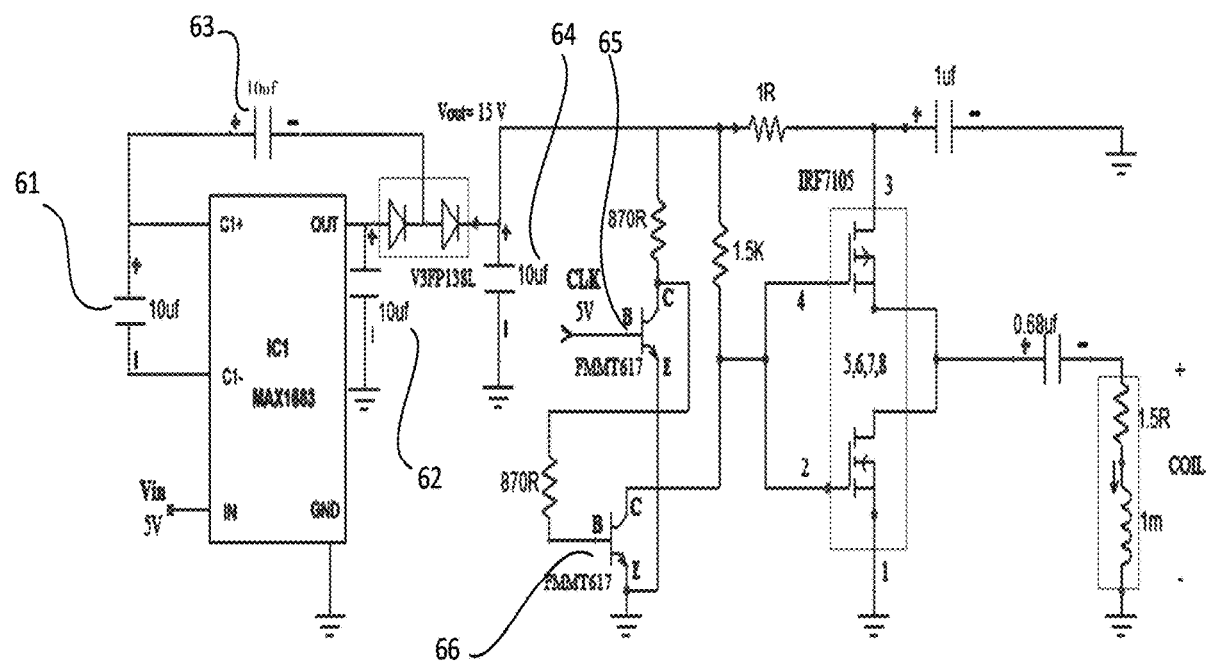
FIG. 8 is a schematic diagram of a current pulse circuit according to Embodiment 1.

FIG. 8 is a schematic diagram of a current pulse circuit according to the present invention. As shown in FIG. 8, the present invention adopts a MAX1683 switched capacitor voltage multiplier as a main control chip, which is configured as a frequency tripler; an input terminal of the chip is connected to an input voltage (Vin=5V), four external capacitors with the capacitance of 10 uF are used, and the four capacitors are described as a first capacitor 61, a second capacitor 62, a third capacitor 63 and a fourth capacitor 64:

Specifically, the first capacitor 61 is connected to C1+ and C1− of the chip; one terminal of the second capacitor 62 is connected to the output terminal OUT of the MAX1683, and the other terminal is grounded, wherein an output terminal OUT of the MAX1683 is sequentially connected with two diodes; an anode of the third capacitor 63 is connected to C1+ of the chip, and a cathode of the third capacitor 63 is connected between two diodes; one terminal of the fourth capacitor 64 is connected to the output terminal of the second diode, and the other terminal is grounded. Further, the no-load output voltage of the circuit is 3Vin-Vdrop, wherein Vin is the input voltage of the chip MAX1683, and Vdrop is the voltage drop of one diode. The influence on the output voltage of the chip MAX1683 is reduced to the lowest by using two diodes. The charging time for the capacitors may be calculated, and the charging time is mainly determined by the impedance of the coil.

Further, in the circuit of FIG. 8, when the pulse signal CLK is 5V in the ON state, a base of the first transistor 65 is 5V, and in this case, the first transistor is turned on, and a first 870-ohm resistor connected to a collector of the first transistor is grounded, causing the second transistor 66 to be turned off and further ungrounding the other terminal of a 1500-ohm resistor connected thereto; according to further analysis, the voltage of the other terminal of the 1500-ohm resistor is a mains voltage, such that a following MOS transistor circuit portion receives the mains voltage as an input; it should be noted that the voltage drop across the resistors may be obtained by circuit analysis; specifically, in this embodiment, the transistors are FMMT617 transistors, and the MOS transistors are IRF7105 MOS transistors.

When the pulse signal CLK is 0V, the first transistor 65 receives 0V voltage and cannot connect the first 870-ohm resistor to the ground. The collector-to-emitter voltage of the first transistor 65 is a mains voltage. The voltage drop across the 870-ohm resistor causes the second transistor 66 to be turned on and further causes the connected 1500-ohm resistor to be grounded such that the input terminal of the MOS transistor circuit portion is grounded.

It should be noted that the first capacitor 61, the second capacitor 62, the third capacitor 63, and the fourth capacitor 64, and the first transistor 65 and the second transistor 66 do not follow a specific sequence and used only for distinction and denotation.

In summary, the two transistors are used to turn on a clock signal so that the clock signal enters the MOS transistors, and the two MOS transistors are used to connect the two terminals of the following 0.68 uF capacitor to the positive voltage and the negative voltage, respectively, so that the sensor spiral hysteresis coil can realize a bipolar signal. Further, a capacitor is connected between the spiral hysteresis coil and the IRF7105 MOS transistors, and its capacitance is 0.68 uF.

Figure 9:
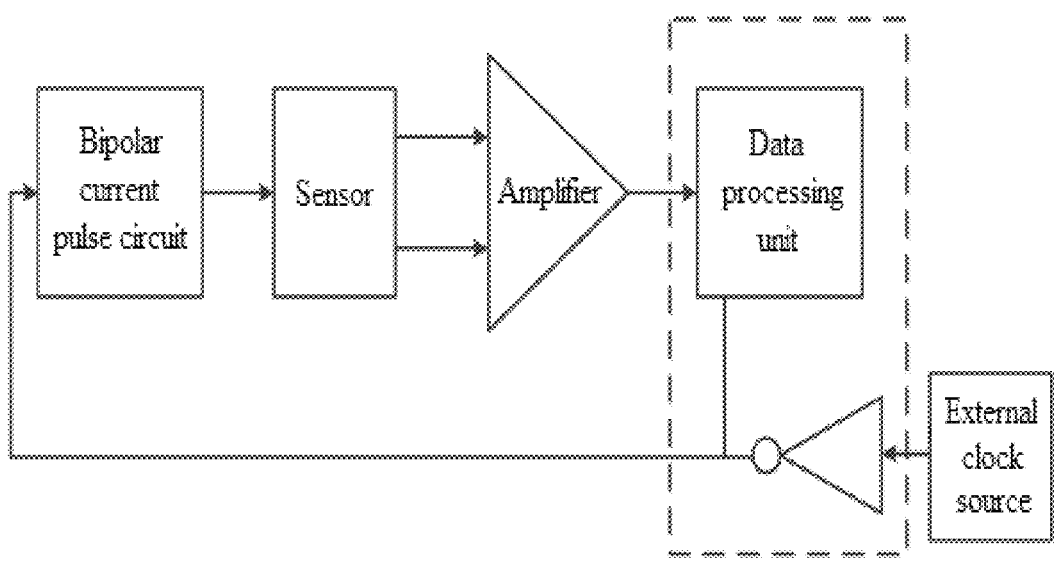
FIG. 9 is a schematic diagram of processing of sensing data according to Embodiment 1.

FIG. 9 is a schematic diagram of processing of sensor data according to the present invention, where the input of the bipolar current pulse circuit may be from a microcontroller or may be an external clock source signal, and the external clock source signal should be synchronized with a data processing unit.

Specifically, in an ideal state, the clock input signal of the bipolar current pulse circuit should be kept at a high level. When the clock pulse is switched from a switch forward state to a zero state, a positive current pulse is generated in the sensor hysteresis coil. When the input clock signal rises from zero to the forward state, it will cause a negative current pulse.

It should be noted that for effective processing of sensor data, any amplifier may be used as a preamplifier, and then the amplified data is fed back to the data processing unit; for example, the rise and fall of the input clock pulse of the bipolar current pulse circuit can be displayed in the data processing unit; the individual sampling of the sensor data is performed in the forward state and the zero state of each clock pulse, and after a delay for a period of time, the sampled sensor data is used for obtaining the current signal in the sensor hysteresis coil.

Specifically, the sampling of the positive voltage V1 output by the sensor is started after the positive current pulse is sensed in the sensor hysteresis coil; the sampling of the negative voltage V2 output by the sensor is started after the negative current pulse is sensed in the sensor coil.

Figure 10:
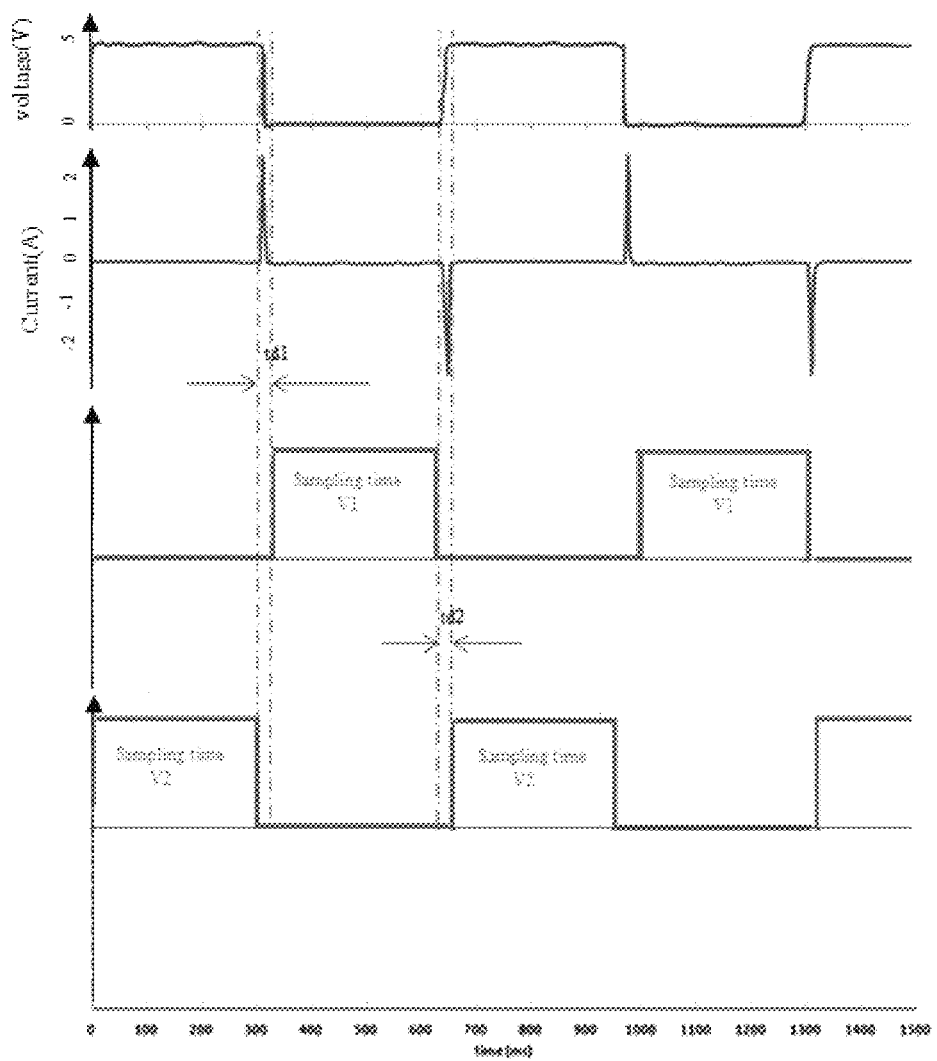
FIG. 10 is a waveform diagram of a detected voltage of a current pulse circuit according to Embodiment 1.

FIG. 10 is a waveform diagram of a detected voltage of a current pulse circuit according to the present invention, where a positive current pulse is applied to read a positive voltage value, and a negative current pulse is applied to read a negative voltage value. Appropriate delay times td1 and td2 are introduced during the sampling time between the positive voltage V1 and the negative voltage V2, where td1 is the time required for the completion of the positive current pulse, and td2 is the time required for the completion of the negative pulse; the output voltage Vout=(V1+V2)/2 is finally obtained according to the positive voltage V1 and the negative voltage V2.

Embodiment 2

Figure 2:
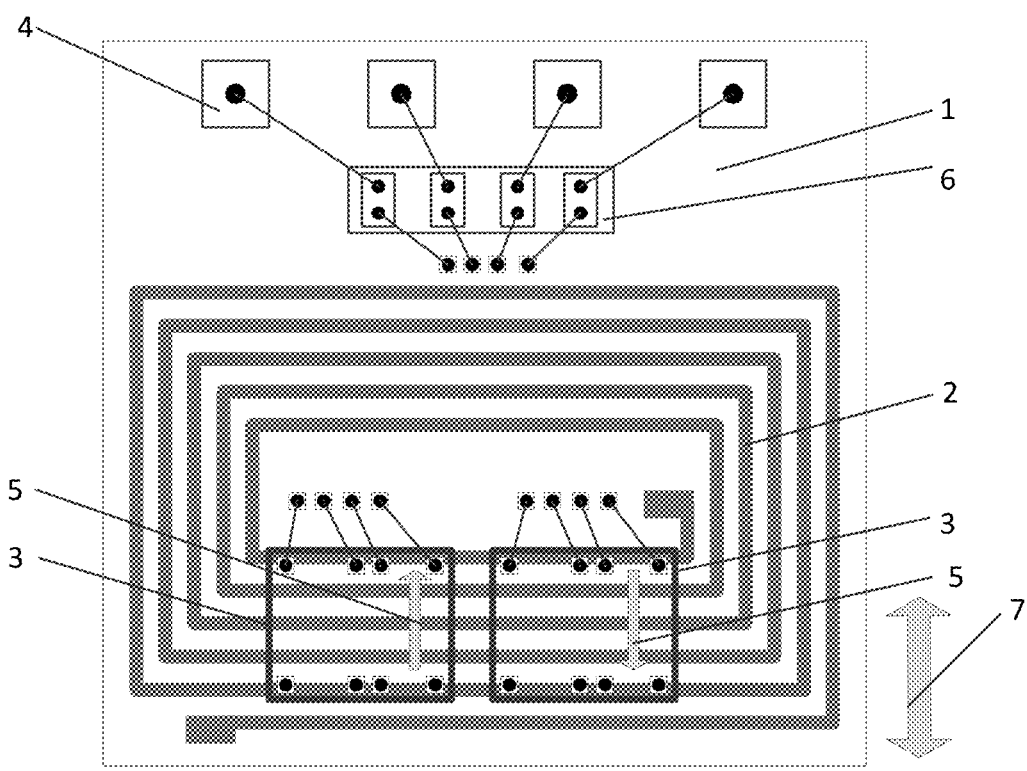
FIG. 2 is a schematic diagram of magnetic field sensing of a single-axis magnetic sensor packaging structure according to Embodiment 2.

This embodiment provides a single-axis magnetic sensor packaging structure, as shown in FIG. 2 which is a schematic diagram of magnetic field sensing of another single-axis magnetic sensor packaging structure according to the present invention. As can be seen from the figure, the schematic diagram of magnetic field sensing of the single-axis magnetic sensor packaging structure in this embodiment differs from that in Embodiment 1 in that:

The spiral hysteresis coil 2 is rectangular, and two sensor bridge arms are disposed. The two sensor chips are located on the same side of the spiral hysteresis coil 2 and constitute a single-axis sensor.

Embodiment 3

Figure 5:
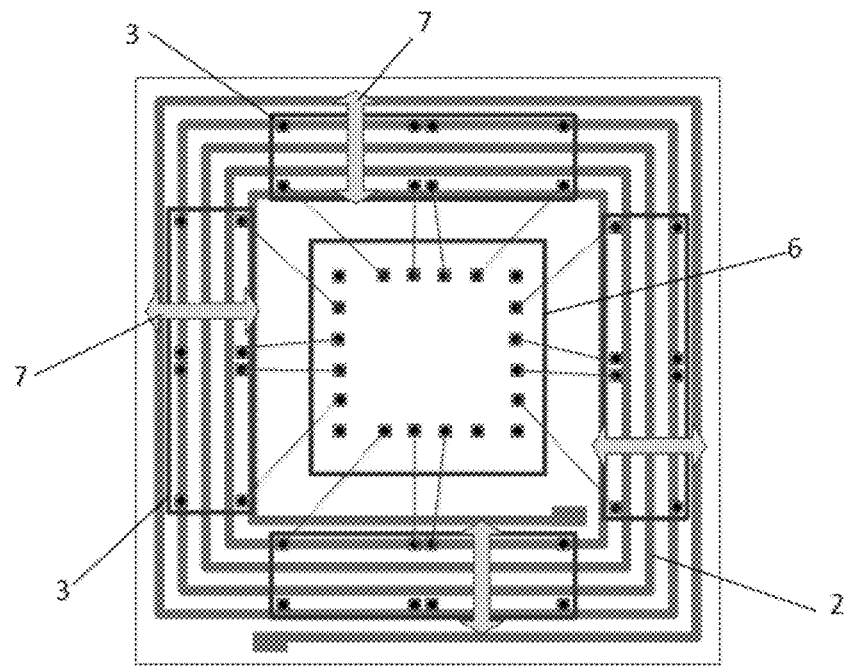
FIG. 5 is a schematic diagram of magnetic field sensing of a double-axis magnetic sensor packaging structure according to Embodiment 3.

This embodiment provides a double-axis magnetic sensor packaging structure, as shown in FIG. 5 which is a schematic diagram of magnetic field sensing of a double-axis magnetic sensor packaging structure according to the present invention. The schematic diagram of magnetic field sensing of the double-axis magnetic sensor packaging structure in this embodiment differs from the schematic diagrams of magnetic field sensing of the magnetic sensor packaging structures in Embodiment 1 and Embodiment 2 in that:

The spiral hysteresis coil 2 is square, four sensor bridge arms are disposed, and sensor chips are respectively located at four sides of the spiral hysteresis coil 2 to form a double-axis sensor, where an ASIC 6 is located at a middle position of the substrate 1.

Embodiment 4

Figure 6:
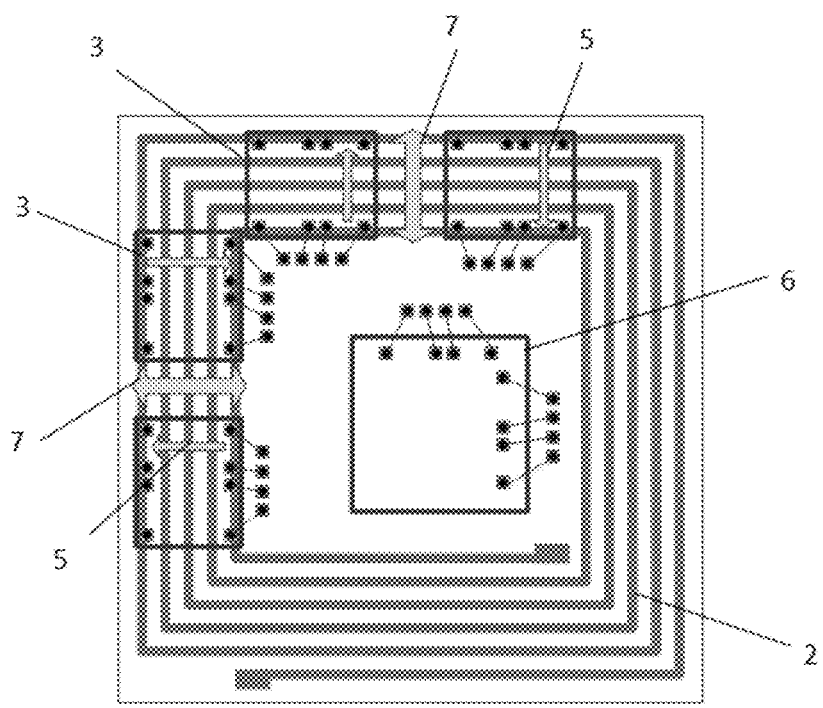
FIG. 6 is a schematic diagram of magnetic field sensing of a double-axis magnetic sensor packaging structure according to Embodiment 4.

This embodiment provides a double-axis magnetic sensor packaging structure, as shown in FIG. 6 which is a schematic diagram of magnetic field sensing of another double-axis magnetic sensor packaging structure according to the present invention. The schematic diagram of magnetic field sensing of the double-axis magnetic sensor packaging structure in this embodiment differs from the schematic diagrams of magnetic field sensing of the magnetic sensor packaging structures in Embodiment 1, Embodiment 2 and Embodiment 3 in that:

The spiral hysteresis coil 2 is square, four sensor bridge arms are disposed, and the sensor bridge arms are located in pair on two adjacent sides of the spiral hysteresis coil 2 to form a two-axis sensor; similarly, the ASIC 6 is located at a middle position of the substrate 1.

In the present invention, the ASIC 6 and the magnetoresistive sensor bridge are electrically connected, and the signal processing circuit and the voltage output circuit are integrated in the ASIC 6. Further, the ASIC 6 is disposed on the LGA substrate 1.

It should be noted that the direction of a magnetic field generated at the push arm by the spiral hysteresis coil 2 is opposite to the direction of a magnetic field generated at the pull arm by the spiral hysteresis coil 2, wherein the push arm is located on one side of the spiral hysteresis coil 2, and the pull arm is located on the other side of the helical hysteresis coil 2 relative to the pull arm.

It should be noted that, in the foregoing embodiments of the present invention, the focuses on the descriptions of the various embodiments are different, and related descriptions in other embodiments may be referred to for parts that are not detailed in an embodiment, such as the part about generation of a magnetic field by current, the part about magnetic field distribution, the portion about voltage output, the portion about the current pulse circuit, the part about the processing of sensing data, and the part about the waveform of the detected voltage of the current pulse circuit.

According to the present invention, the spiral hysteresis coil is deposed on the substrate, so that the magnetic sensor has a smaller overall resistance and thus can carry larger current; the packaging structure not only eliminates the hysteresis generated by the sensor itself in a hysteresis cycle but also further reduces the hysteresis generated during measurement. In addition, the manufacturing process of the magnetic sensor packaging structure is simple and cost effective.

All other embodiments obtained by a person of ordinary skill in the art based on the embodiments of the present invention without creative efforts shall fall within the scope of the present invention. While the present invention has been shown and described with respect to the preferred embodiments of the present invention, a person skilled in the art will appreciate that various changes and modifications may be made to the invention without departing from the scope defined by the appending claims of the present invention.

The invention claimed is:

1. A magnetic sensor packaging structure with a hysteresis coil, the magnetic sensor comprising:
   a substrate;
   a sensor chip;
   a spiral hysteresis coil disposed on the substrate;
   wire bonding pads;
   a pulse generating circuit configured to provide voltage pulses to the spiral hysteresis coil; and
   a signal processing circuit,
   wherein sensor bridge arms are deposited on the sensor chip,
   wherein the sensor bridge arms are electrically interconnected to form a magnetoresistive sensor push-pull bridge, the sensor bridge arms comprise a push arm and a pull arm of the magnetoresistive sensor push-pull bridge, the push arm and the pull arm of the magnetoresistive sensor push-pull bridge are composed of magnetoresistive sensing elements, and the magnetoresistive sensor push-pull bridge is a magnetoresistive sensor push-pull half bridge or a magnetoresistive sensor push-pull full bridge,
   wherein the magnetoresistive sensor push-pull bridge is disposed on the spiral hysteresis coil and is located on the substrate and encapsulated, a magnetic field generated by the spiral hysteresis coil is collinear with a sensitive axis of the sensor bridge,
   wherein the pulse generating circuit is configured to provide a positive voltage pulse to the spiral hysteresis coil to cause the spiral hysteresis coil to provide a positive magnetic field pulse and is configured to provide a negative voltage pulse to the spiral hysteresis coil to cause the spiral hysteresis coil to provide a negative magnetic field pulse, and
   wherein the positive magnetic field pulse is applied to read a positive voltage V1 and the negative magnetic field pulse is applied to read a negative voltage V1, and the signal processing circuit is configured to calculate an output voltage Vout=(V1+V2)/2, and output the output voltage Vout through a voltage output circuit.

2. The magnetic sensor packaging structure with a hysteresis coil according to claim 1, wherein:
   the substrate is a Land Grid Array (LGA) substrate;
   the spiral hysteresis coil is deposited on the LGA substrate;
   the push arm of the magnetoresistive sensor push-pull bridge is deposited on a sensor chip;
   the pull arm of the magnetoresistive sensor push-pull bridge is deposited on another sensor chip; and
   the sensor chips are deposited on the LGA substrate.

3. The magnetic sensor packaging structure with a hysteresis coil according to claim 2, further comprising: an Application-Specific Integrated Circuit (ASIC),
   wherein the ASIC and the magnetoresistive sensor push-pull bridge are electrically connected, and the signal processing circuit and the voltage output circuit are both integrated in the ASIC.

4. The magnetic sensor packaging structure with a hysteresis coil according to claim 3, wherein the ASIC is disposed on the LGA substrate.

5. The magnetic sensor packaging structure with a hysteresis coil according to claim 1, wherein the spiral hysteresis coil is disposed on a plane above or below the magnetoresistive sensing elements.

6. The magnetic sensor packaging structure with a hysteresis coil according to claim 1,
wherein the magnetic sensor packaging structure adopts single chip packaging,
wherein pinning layer directions of the magnetoresistive sensing elements are set by laser heating magnetic annealing.

7. The magnetic sensor packaging structure with a hysteresis coil according to claim 1, wherein there are two or four sensor bridge arms that constitute a single-axis sensor, and the pinning layer directions of the magnetoresistive sensing elements of the oppositely disposed sensor bridge arms are opposite.

8. The magnetic sensor packaging structure with a hysteresis coil according to claim 1, wherein there are four or eight sensor bridge arms that constitute a double-axis sensor, and the pinning layer directions of the magnetoresistive sensing elements of the oppositely disposed sensor bridge arms are opposite.

9. The magnetic sensor packaging structure with a hysteresis coil according to claim 1, wherein the output voltage is remotely acquired by a data calculation system.

10. The magnetic sensor packaging structure with a hysteresis coil according to claim 1, wherein the direction of a magnetic field generated at the push arm by the spiral hysteresis coil is opposite to the direction of a magnetic field generated at the pull arm by the spiral hysteresis coil, the push arm is located on one side of the spiral hysteresis coil, and the pull arm is located on the other side of the helical hysteresis coil relative to the pull arm.

* * * * *

UNITED STATES PATENT AND TRADEMARK OFFICE
CERTIFICATE OF CORRECTION

PATENT NO. : 11,852,698 B2
APPLICATION NO. : 16/497409
DATED : December 26, 2023
INVENTOR(S) : Deak et al.

Page 1 of 1

It is certified that error appears in the above-identified patent and that said Letters Patent is hereby corrected as shown below:

In the Claims

In Column 8, Line 40, in Claim 1, delete "negative voltage V1," and insert --negative voltage V2,-- therefor Signed and Sealed this
Seventh Day of May, 2024

Katherine Kelly Vidal
*Director of the United States Patent and Trademark Office*